(12) United States Patent
Langer et al.

(10) Patent No.: US 7,673,520 B2
(45) Date of Patent: Mar. 9, 2010

(54) DEVICE AND METHOD FOR TESTING ELECTRONIC COMPONENTS

(75) Inventors: Alfred Langer, Kiefersfelden (DE); Christian Hellmuth, Stephanskirchen (DE)

(73) Assignee: RASCO GmbH, Kolbermoor (DE)

( * ) Notice: Subject to any disclaimer, the term of this patent is extended or adjusted under 35 U.S.C. 154(b) by 80 days.

(21) Appl. No.: 11/683,279

(22) Filed: Mar. 7, 2007

(65) Prior Publication Data
US 2007/0212201 A1 Sep. 13, 2007

(30) Foreign Application Priority Data
Mar. 8, 2006 (EP) .................. 06004765
Nov. 28, 2006 (EP) .................. 06024651

(51) Int. Cl.
*G01R 31/01* (2006.01)
(52) U.S. Cl. ........................................ 73/763; 324/537
(58) Field of Classification Search .................. 73/760, 73/763; 324/537, 765; 414/225.01
See application file for complete search history.

(56) References Cited

U.S. PATENT DOCUMENTS

| | | | | |
|---|---|---|---|---|
| 4,128,174 A * | 12/1978 | Frisbie et al. | ................ | 209/573 |
| 4,506,213 A | 3/1985 | O'Connor | | |
| 4,691,831 A * | 9/1987 | Suzuki et al. | ................ | 209/573 |
| 5,151,651 A * | 9/1992 | Shibata | ........................ | 324/754 |
| 5,184,068 A * | 2/1993 | Twigg et al. | ................. | 324/755 |
| 5,650,732 A * | 7/1997 | Sakai | .......................... | 324/755 |
| 5,801,527 A | 9/1998 | Ishii et al. | | |
| 5,919,024 A | 7/1999 | Fujimori et al. | | |
| 6,163,146 A * | 12/2000 | Suzuki et al. | ............. | 324/158.1 |
| 6,339,321 B1 * | 1/2002 | Yamashita et al. | ........ | 324/158.1 |
| 6,364,089 B1 * | 4/2002 | Singh et al. | .................. | 198/408 |
| 6,479,777 B2 * | 11/2002 | Yamakawa | ................... | 209/574 |
| 6,518,745 B2 * | 2/2003 | Kim et al. | ................. | 324/158.1 |
| 6,579,057 B2 * | 6/2003 | Mimata et al. | .............. | 414/627 |
| 6,831,454 B2 * | 12/2004 | Bae et al. | ................. | 324/158.1 |

(Continued)

FOREIGN PATENT DOCUMENTS

DE 3715671 A1 11/1988

(Continued)

OTHER PUBLICATIONS

European Search Report for EP 06004765, issued Aug. 31, 2006.

(Continued)

*Primary Examiner*—Lisa M Caputo
*Assistant Examiner*—Freddie Kirkland, III
(74) *Attorney, Agent, or Firm*—Kenyon & Kenyon LLP

(57) ABSTRACT

The invention relates to a device for testing electronic components (3) with at least two mechanical transfer elements (5a, 5b), of which each can be loaded in each case at a dedicated loading position with an electronic component (3) and with a common test position (7), into which the two transfer elements (5a, 5b) can be brought. Furthermore, the invention relates to a device for testing electronic components with at least two mechanical transfer elements (80a, 80b), of which each can be loaded in each case at a common loading position (88) with an electronic component (3) and with a common test position (89), into which the two transfer elements (80a, 80b) can be brought. The invention also relates to the associated method.

21 Claims, 9 Drawing Sheets

U.S. PATENT DOCUMENTS

Figure 1:
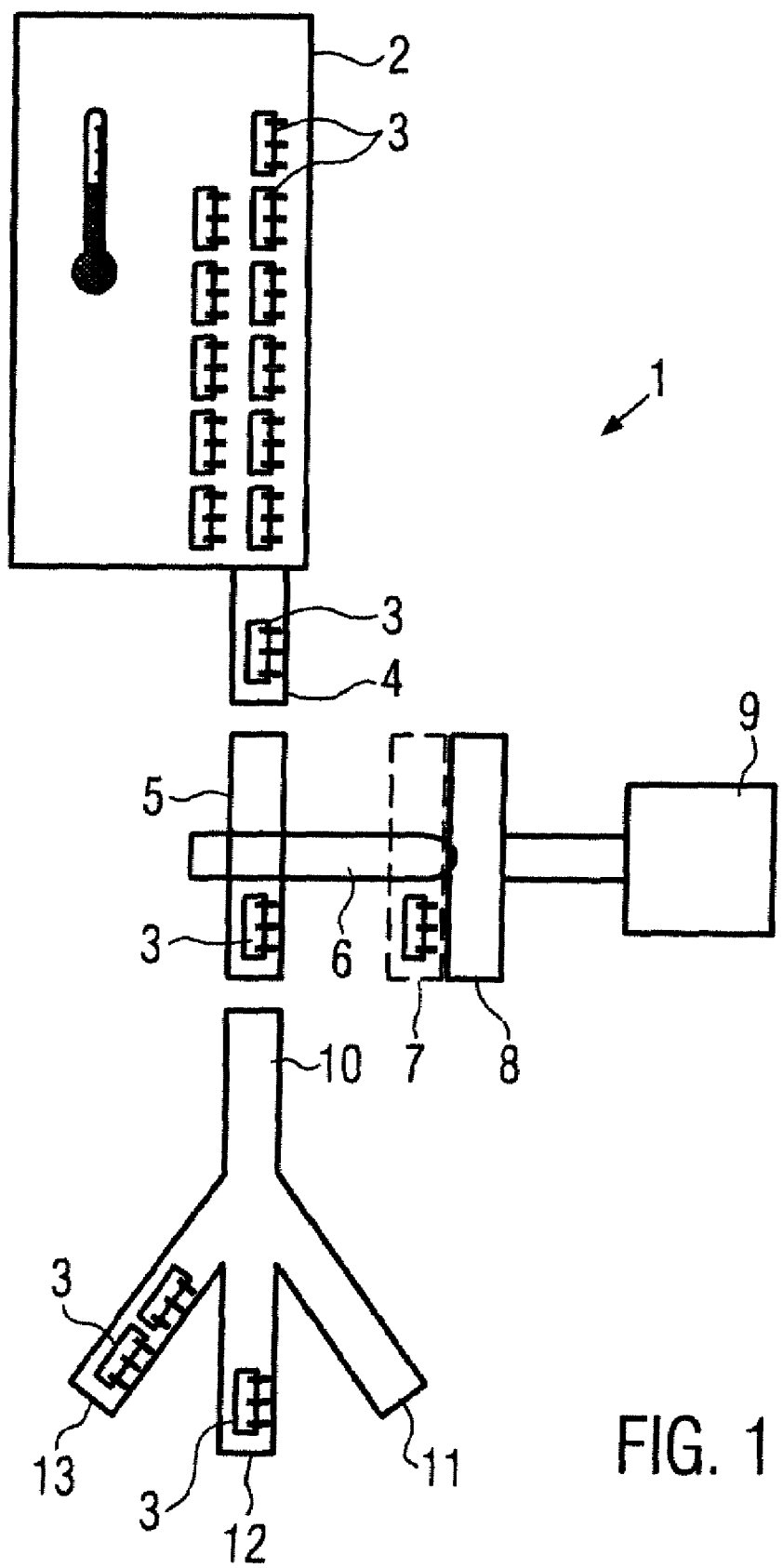

| | | |
|---|---|---|
| 7,183,785 B2 * | 2/2007 | Roberts et al. ............... 324/763 |
| 7,225,531 B2 * | 6/2007 | Hwang ........................ 29/739 |
| 7,274,202 B2 * | 9/2007 | Kolman ...................... 324/765 |
| 2004/0164723 A1 | 8/2004 | Bae et al. |
| 2005/0168233 A1 * | 8/2005 | Roberts et al. ............... 324/763 |

FOREIGN PATENT DOCUMENTS

| | | | |
|---|---|---|---|
| WO | 92/04989 A | 4/1992 | |
| WO | 1992004989 A | 4/1992 | |

OTHER PUBLICATIONS

European Search Report for EP 06024651.9, dated Jun. 6, 2007.

* cited by examiner

DEVICE AND METHOD FOR TESTING ELECTRONIC COMPONENTS

Electronic components are normally tested for their electronic or electrical characteristics after production. This can be carried out both at ambient temperature as well as at increased or reduced temperature.

It is known that electronic components can be passed to an electrical testing head which then tests the electronic characteristics of the component.

In this respect it is an advantage if the feeding and removal of electronic components to the electrical testing head occurs as quickly as possible so that as many electronic components as possible can be tested in the specified time period.

To increase the throughput rates it is known that a number of parallel, adjacent electrical testing heads can be arranged to which electronic components are passed in parallel and independent of one another for testing.

A measure of the quality of the device which passes the electronic components to the electrical testing head, is the so-called index time. This is the time needed to exchange a tested component for one that is still to be tested.

The object of the invention is to reduce the index time.

This object is solved by a device according to Claims 1 and 16 and by a method according to Claims 20 or 21.

Preferred embodiments are given in the dependent claims.

The device comprises two loading positions and a common test position. With transfer elements an electronic component can be passed from in each case one or two loading positions to the common test position. While one electronic component is being tested, the other transfer element can output a tested component and accept a component to be tested.

The index time is thus only determined by the time which is needed to exchange the two transfer elements in the test position. The time which is needed to output an electronic component from a transfer element and to load it with a new electronic component which is to be tested is then no longer relevant. This applies at least provided the electrical testing time is longer than the time needed to remove an electronic component from a transfer element and to pass a component to be tested to it.

The path which a transfer element can take between the loading position and the test position can be designed in many different ways. It can, for example, be in a straight line, curve-shaped, S-shaped or also be composed of straight-line, curve-shaped or S-shaped sections.

Furthermore, the orientation of the transfer element in the loading position and in the test position can be the same. This means that the transfer element could be transferred from the loading to the test position with a pure translational movement without it being superimposed with a rotational movement of the transfer element.

The avoidance of superimposed rotational movements of the transfer elements along the path between the loading and test positions simplifies exact positioning of the electronic components in the transfer element in the test position.

However, it is also possible that the transfer elements take on various orientations in the loading and test positions. This facilitates other driving methods and other configurations which lead to a more compact embodiment.

Furthermore, it is also advantageous if the paths between the two loading positions and the common test position run congruently to at least directly in front of the test position. This facilitates the arrangement of the two paths such that the electrical contacts of the electrical testing head are worn as little as possible, because a laterally aligned motional component on contacting the electrical contacts of the electrical testing head is avoided. A perpendicular meeting of the contacts is advantageous for low contact wear.

The paths for the transfer elements can be realised in various ways. For example, guides such as rods, rails, grooves, cranks or similar devices are possible. This type of embodiment facilitates a permanently defined path guide which has a low susceptibility to wear.

Flexible designs, for example with a single, dual or multiple-axle drive, facilitating variable paths for the transfer elements, are also possible. With a dual or multiple-axle drive the paths are, for example, defined by an appropriate control unit. The paths can be varied by reprogramming the control unit.

One embodiment in which the two transfer elements are connected to a common driving means is particularly advantageous. Consequently, it is possible to provide just one driving means for both transfer elements, which leads to an inexpensive embodiment.

The two transfer elements can be joined by mechanically rigid joining elements, such as rods, shaped elements or similar devices to the common driving means. This facilitates devices which are as simple and as reliable as possible.

A common driving means which is particularly advantageous is a rotating element, such as a rotary table or a rotating cylinder or also a rotating rod which can be driven pneumatically, electrically, hydraulically or by a stepper motor or servomotor. This type of driving means with a rotating element comprises in each case parts of a rotating element with opposed directions of motion, which can be used for the opposed movements of two transfer elements.

The electronic components can be passed to both loading positions independently via two separate channels. It is however also possible to provide an at least partially common channel, which is separated into two subchannels just in front of the respective loading positions. With the failure of a loading position or a transfer element the other can then continue to be operated even if with less total capacity. This is particularly advantageous if, for example, only a few components are still to be tested.

In a particularly advantageous embodiment one or other or both transfer elements are coupled in each case to a further transfer element. Thus for example, two transfer elements can be provided one above the other which are coupled together such that they preferably can move simultaneously. If both transfer elements comprise a further transfer element in each case, then a total of four transfer elements are provided. Thus, for example, in each case two can be arranged one above the other and in each case one adjacent to the other. The two transfer elements which are positioned one above the other are coupled together for simultaneous movement, whereas the adjacent elements are provided for alternating movement.

The device is preferably a gravity handler. With a gravity handler the electronic components to be tested are moved by the force of gravity. In this respect they are moved along a transport path by the force of gravity. Thus the electronic components can, for example, drop into the transfer elements by the effect of the force of gravity and/or drop out of them by the effect of the force of gravity.

With a gravity handler the path which the electronic components take for testing is essentially arranged vertically, but can also be slightly tilted in certain regions.

The counterpart to gravity handlers are the so-called pick-and-place handlers in which the electronic components are moved essentially horizontally by appropriate devices and not by the force of gravity and are on the contrary moved in a controlled manner by appropriate devices. Another device for the testing of electronic components comprises two mechanical transfer elements which however exhibit a common loading position and a common test position.

While one electronic component is being tested, a tested component is removed from the other transfer element and it is loaded with an electronic component to be tested. This can take place simultaneously with the testing of another electronic component so that time is gained.

It is advantageous in this respect if each transfer element in the common loading position and in the common test position has in each case the same orientation. The avoidance of rotary movements of the transfer elements leads to an improved positional accuracy of the electronic components in the respective transfer element.

In this respect it is advantageous if the two transfer elements are driven by a common drive element, wherein it is designed such that with only one drive element causing a movement of the transfer elements, the movement from the loading position into the test position can be achieved. This facilitates fast interchange of the two transfer elements. If several drive elements have to be used for different sections of the movement, this increases the time requirement, because the two movements must be executed consecutively. However, an embodiment with two or three or more driving means is not excluded.

Also this device is preferably a gravity handler. Here, the loading of the transfer elements occurs respectively by a movement of electronic components which is caused by the force of gravity. Otherwise, for example, the same applies as for the gravity handler described above.

With the method a first transfer element is loaded with a first (still to be tested) electronic component in a first loading position and at least partly simultaneously a second electronic component is tested in a second transfer element in a test position. After conclusion of the test, the second transfer element is moved out of the test position and then or at least partially simultaneously the first transfer element is passed to the common test position.

With another method a first transfer element is loaded with a first (still to be tested) electronic component in a common loading position and at least simultaneously an electronic component of a second transfer element is tested in a test position. The second transfer element is in this case located in the test position. Thereafter, the second transfer element is moved away from the common test position and then or at least partially simultaneously the first transfer element is passed to the test position.

Figure 3:
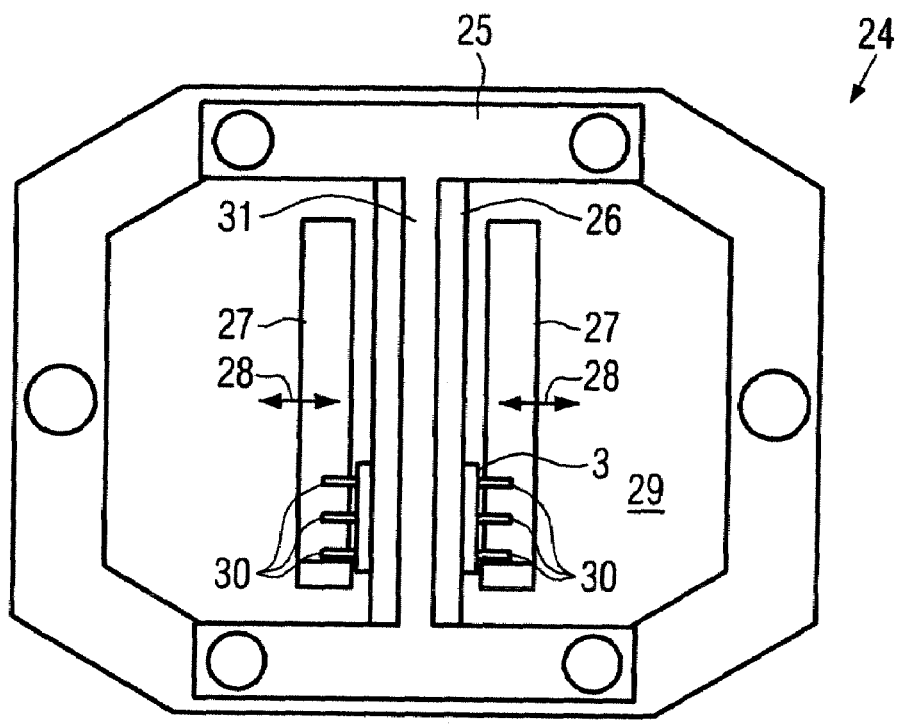
Figure 4:
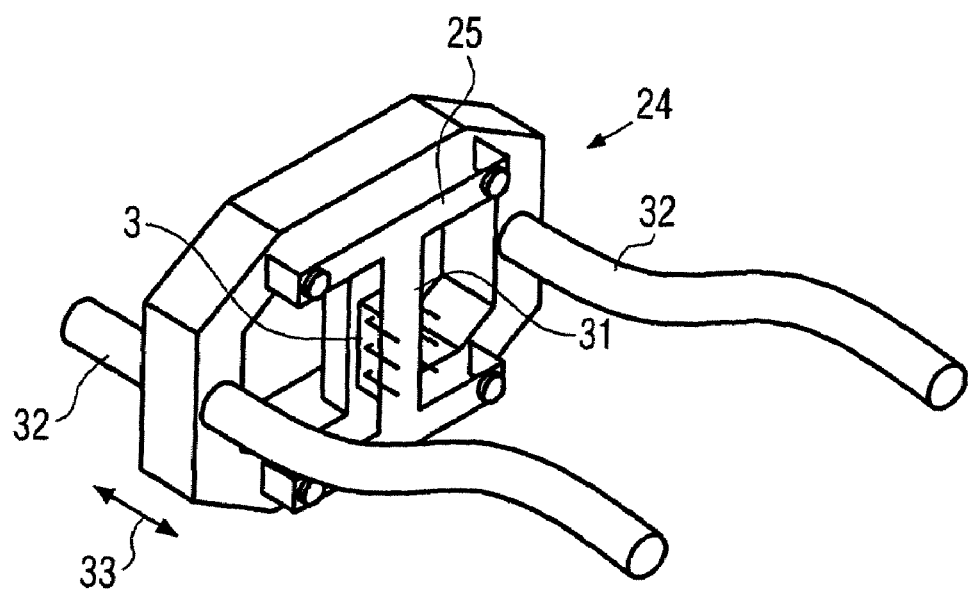
Figure 6:
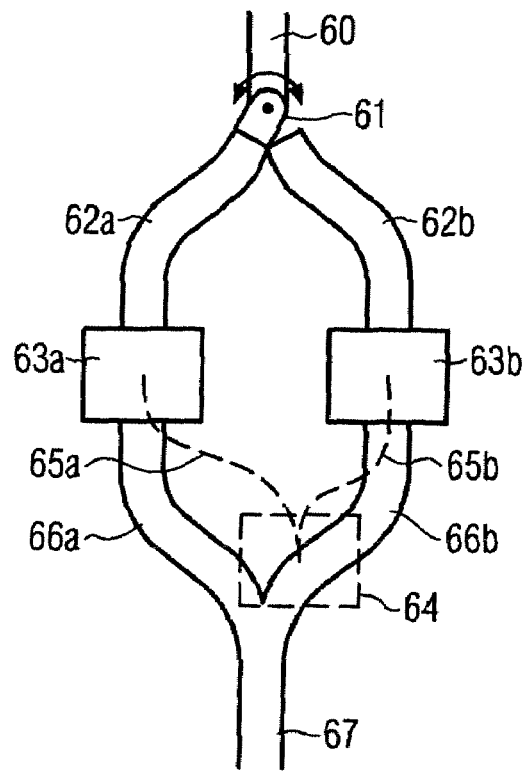
Figure 7:
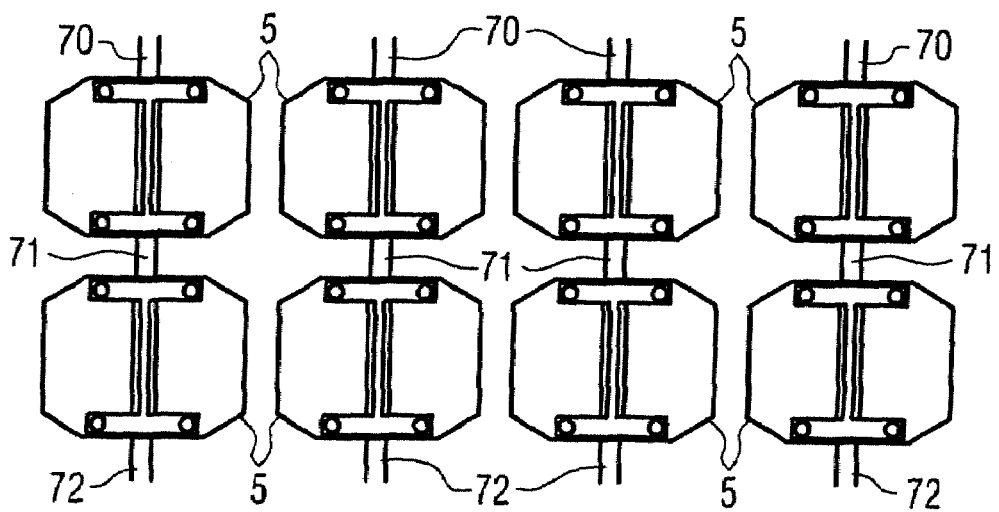

Preferred embodiments of the invention are explained based on the enclosed figures. The following are illustrated:

FIG. 1 a schematic view of a device for the testing of electronic components;

FIG. 2 various possible configurations for transfer elements in the loading and test positions;

FIG. 3 a detail view of a transfer element;

FIG. 4 a three-dimensional schematic view of a transfer element with guides;

FIG. 5 possible embodiments of the drive and the guide of transfer elements;

FIG. 6 a schematic view of feed and removal channels together with transfer elements;

FIG. 7 a schematic view of a number of transfer elements arranged adjacently and one above the other;

FIG. 8 an alternative embodiment with a common loading position;

FIG. 9 various states during a run through the process.

FIG. 1 shows a schematic view of a device 1 for the testing of electronic components 3. The electronic components 3, such as typically IC chips or similar components, can be heated or cooled in a temperature stabilising device 2 to a predetermined temperature. The temperature stabilising device 2 does not however need to be used or provided. Testing the components at room temperature is also possible.

As can be seen in FIG. 1, the device is a gravity handler. The path taken by the electronic components is essentially vertical.

From the temperature stabilising device 2, the electronic components 3 are singled out and passed along a guide channel 4 to a transfer element 5. In this respect a suitable singling out device can be provided and one or more stoppers to specifically stop the various electronic components along the channel. The movements of the electronic components are caused, at least in part, by the force of gravity.

An electronic component 3 is introduced into the transfer element 5 (e.g. by dropping into it), as illustrated in FIG. 1. The transfer element 5 can then be brought along the guide 6 into the test position 7. Adjacent to the test position 7, there is an electrical testing head 8, which is controlled by a test device 9 which is illustrated schematically. With the electrical testing head 8, the electrical terminals of an electronic component 3 can be contacted in order to test it in relation to its electronic characteristics.

Once the test is concluded, the transfer element 5 is moved back from the test position 7 into the loading position (refer to FIG. 1) in order to output the tested electronic component 3 downwards (e.g. by dropping down due to the force of gravity) and a new electronic component still to be tested is accepted from above.

In FIG. 1 only one transfer element 5 can be seen in the illustration, because a second transfer element is covered by the first transfer element.

Downstream of the transfer element 5 various branches can be provided to guide the tested electronic components 3 into one or other ejection channel or reservoir 11, 12, 13, depending on the test result.

FIG. 2 illustrates sectional views at the height of the transfer element 5 shown in plan view in FIG. 1. The illustrations are schematic and show essentially the respective loading positions of a transfer element 5a, 5b and the test position 7.

Figure 2A:
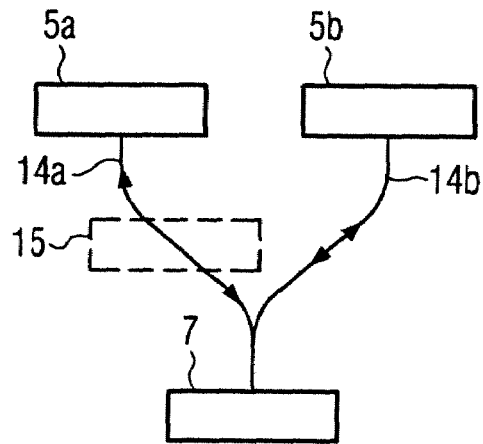

In FIG. 2a a first transfer element 5a and a second transfer element 5b are arranged adjacently. Each of these two transfer elements can be loaded with electronic components 3 (from above, i.e. from a direction above the drawing plane) and each of these transfer elements can output tested electronic components downwards (in a direction below the drawing plane).

The two transfer elements 5a, 5b can each be transferred individually into the common test position 7 along the paths 14a, 14b. The return occurs in each case along the same path. However, other paths are also possible for the return.

With the variant illustrated in FIG. 2a an intermediate position with the reference number 15 is indicated. As can be seen, the transfer element 5a in the position 15 exhibits the same orientation as in the loading position or as in the test position 7. From the loading position the transfer element 5a can be transferred with a purely linear displacement into the position 15 or the position 7 without a rotational movement being superimposed. This means that the orientation is in each case the same.

Figure 2B:
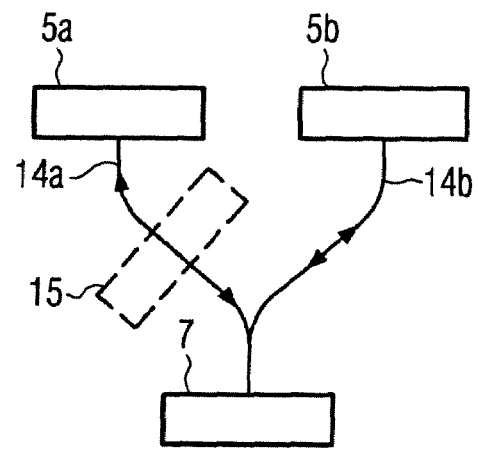

Alternatively to this, FIG. 2b shows that the intermediate position 15' can also be rotated relative to the loading or test position 7. In this respect an embodiment of this nature is advantageous in which the orientation of the transfer element 5a, 5b does not, or does not significantly change in comparison to the tangent of the path 14a, 14b on which the transfer element 5a, 5b is currently located. This simplifies the guidance along defined guides. The loading and the test position 7 however exhibits the same orientation even when in FIG. 2b the intermediate position is rotated.

In FIGS. 2a and 2b the paths 14a, 14b are formed from two curve-shaped pieces with opposing curve directions. Thus, essentially S-shaped curves are formed.

Figure 2C:
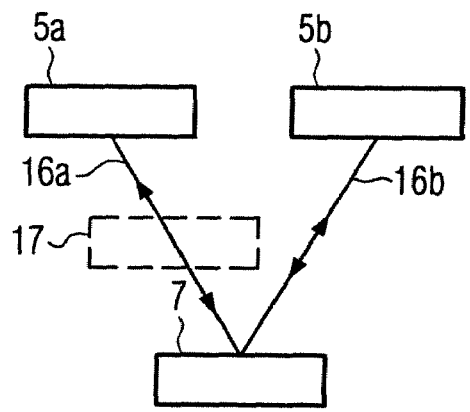

As displayed in FIG. 2c, the transfer elements 5a, 5b can be guided into the test position 7, but also along straight-line paths 16a, 16b. A corresponding intermediate position is illustrated under reference number 17.

Figure 2D:
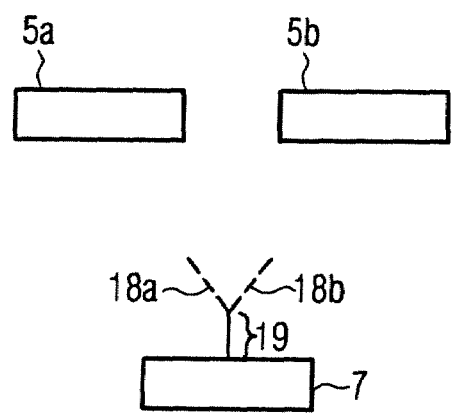

FIG. 2d furthermore illustrates that directly in front of the test position 7 a path section 19 can be provided, along which the paths 18a, 18b, which are only outlined here in dashes schematically, lie congruently one above the other. This facilitates the vertical running in of the transfer elements 5a, 5b onto the electrical testing head 8. Consequently, wear of the electrical contacts of the electrical testing head 8 is reduced, because no grinding lateral movements occur, as could occur for example in FIG. 2c.

The paths 18a and 18b in FIG. 2d can be formed in a straight line or curved, formed in an S-shape or any other shape.

Figure 2E:
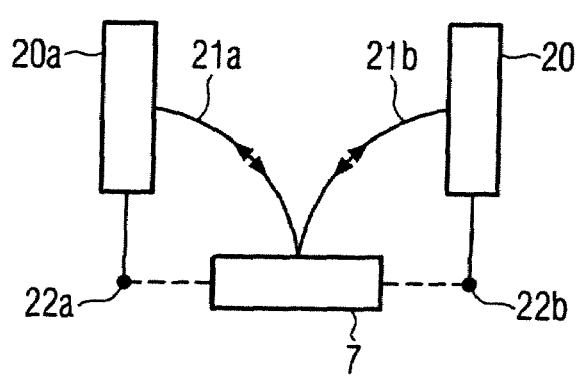

In FIG. 2e the two loading positions of transfer elements 20a, 20b are not adjacent, but rather arranged opposite one another. The positions illustrated in FIG. 2e arise through 90° rotation of the positions in FIGS. 2a-2d. However, also larger or smaller angles of rotation than 90° are conceivable, such as for example 30°, 45°, 60° or more or less than 30°, 45°, or 60°.

With the embodiment illustrated in FIG. 2e a transfer element 20a, 20b can be brought into the test position 7 by a swivel movement. Furthermore, vertical introduction into the test position 7 is also ensured here. The transfer element 20a can be transferred into the position 7 about a swivelling axle 22a. This is a pure rotational movement without a linear component. The same applies to the transfer element 20b when swivelled about the axle 22b. The respective paths are labelled with 21a, 21b.

Figure 2F:
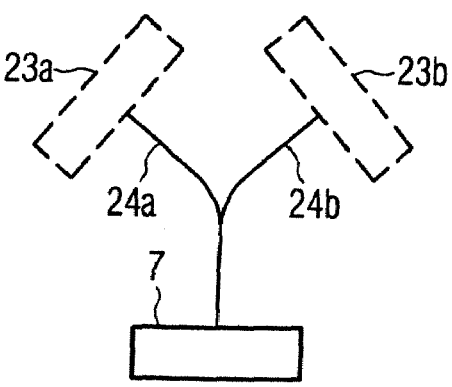

In FIG. 2f a further possible embodiment is shown in which the loading position of the transfer elements 23a and 23b are located diagonally in relation to the positions in FIGS. 2a-2d and 2e. From a position of this nature the transfer of the transfer elements 23a, 23b into the test position 7 can be achieved with a purely rotational movement or, as illustrated in FIG. 2f, with a movement which is composed of a straight, a curved and a straight movement. The required angles of rotation are smaller in comparison to FIG. 2e so that the movement can be executed faster.

A detail view of a transfer element is illustrated in FIG. 3. It bears the reference number 24 and corresponds to the transfer elements 5a, 5b, 20a, 20b, 23a, 23b in FIG. 2.

In FIG. 4 a three-dimensional schematic view of the transfer element 24 from FIG. 3 is schematically illustrated.

The transfer element 24 exhibits a frame around one or two openings 29 on which a double T-shaped element 25 with a bridge 31 is attached. An electronic component to be tested can slide downwards from above between the base of the transfer element 24 and the bridge 31. In order to hold the electronic component 3 to be tested in the transfer element 24, a stopper 27 is provided, which can engage the electrical contacts 30 of an electronic component 3 to be tested with appropriate projections (refer to the lower end of the stopper 27). Other stoppers, which engage the body of the electronic component to be tested, are additionally or alternatively possible. Vacuum apertures, which firmly suck onto an electronic component, can also be provided as stoppers.

The electronic component 3 can be released by a movement of the stoppers 27 outwards (direction 28) so that it can slide out downwards.

On the bridge element 31 of the double T-shaped part 25 an insulator material 26 is arranged which provides insulation for the electrical contacts 30 of the electronic component 3 against the bridge 31 and guides the electronic component.

With the positioning of the electronic component 3 illustrated in FIGS. 3 and 4 the electronic contacts are accessible externally and can be contacted by the contacts of the electrical testing head 8.

In FIG. 4 a guide of rods 32 is additionally shown as an example. The transfer element 24 can be moved forwards and backwards in the direction 33 along these rods 32. As can be seen in FIG. 4, for example an S-shaped guide for the transfer element 24 is thus possible.

Figure 5A:
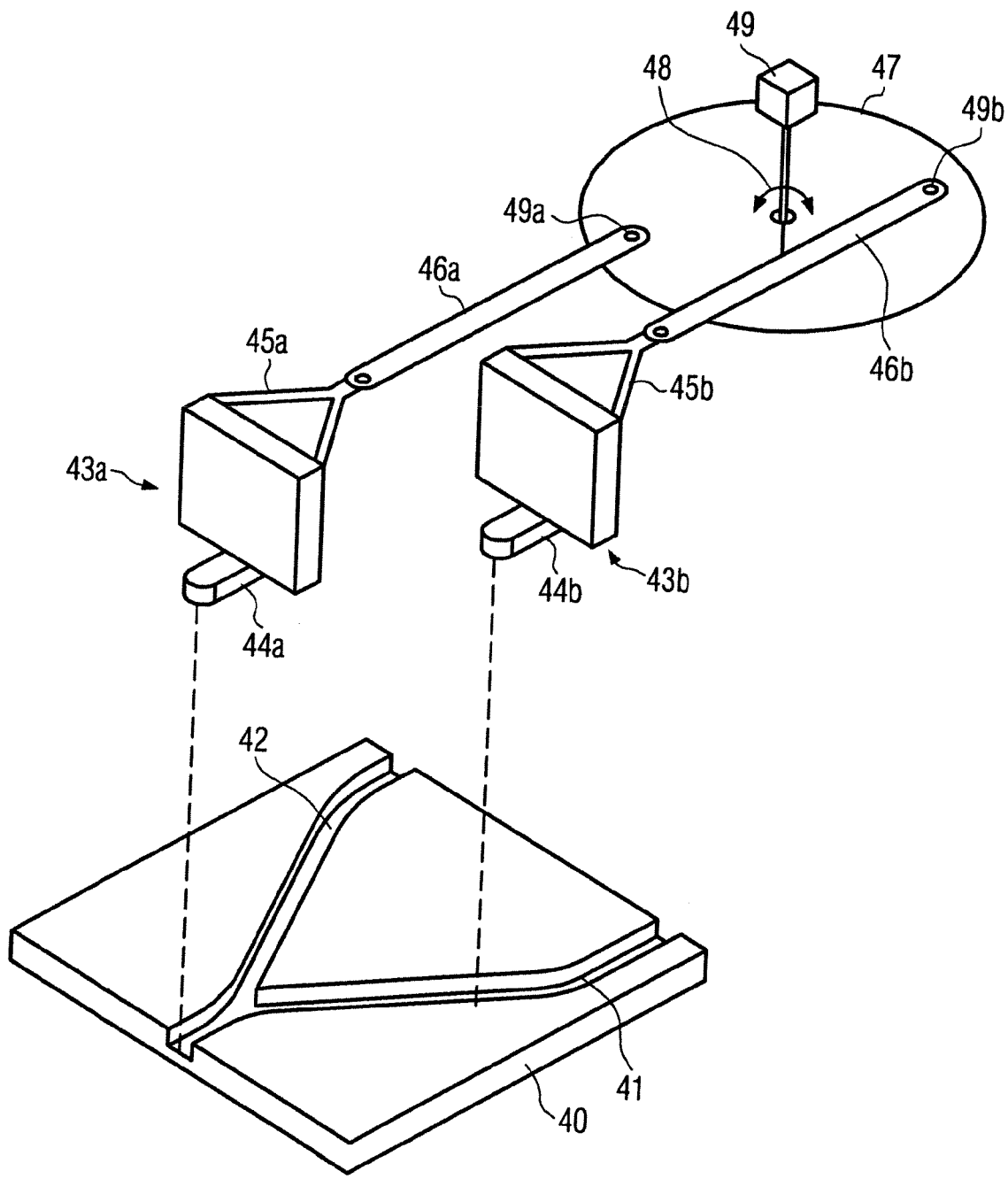

In FIG. 5a a preferred variant for the drive of the transfer elements is illustrated. Here, the transfer elements have the reference numbers 43a and 43b.

A plate 40 with grooves 41 and 42 is provided below the transfer elements. For a better graphical illustration this plate 40 is shown here below along the dashed line, offset as in an exploded drawing.

Shuttles 44a, 44b can slide in the grooves 41 and 42. These shuttles 44a, 44b can be arranged partially in front of or behind the respective transfer element 43a, 43b or also on both sides of it.

The shuttles are advantageously at least so long that they are longer than the common path section of the grooves 41, 42 on the common path section positioned at the front left in FIG. 5a. This ensures that a shuttle 44b entering the groove 41 is also guided back again into this groove. This applies correspondingly to shuttle 44a.

Instead of two grooves running into one another, two separate path guides can also be provided. This is, for example, possible in that the shuttles are not located centrally at the transfer elements, but rather are in each case offset to the outside. This is also advantageous for an output of the tested electronic components, because otherwise a shuttle could be in the way.

A holder 45a or 45b is arranged together with a rod 46a, 46b on the transfer elements 43a, 43b. The rods 46a, 46b are connected via rotational points 49a, 49b to a rotatable disc 47.

The disc 47 can essentially be rotated to and fro, wherein this occurs about an axle 48 using a motor 49. The motor 49 can be a pneumatic motor actuator, a stepper motor, a servomotor or another type of motor.

The connection between the rotatable disc 47 and the transfer elements 43a, 43b can also be realised via the shuttles 44a, 44b in that the rods 46 or the holders 45 engage the shuttles.

With the state illustrated in FIG. 5a the shuttle of the transfer element 44a is right at the front in the plate 40 so that the transfer element 43a is located in the test position. The other shuttle is located in the loading position on the right.

By rotating the disc 47 clockwise by approx. 150° C. the transfer element 43a is pulled backwards by the rod 46a, while at the same time the transfer element 43b is pushed forwards by the rod 46b. Consequently, the transfer element 43b is brought into the test position and the transfer element 43a is guided back into the left loading position.

Figure 5B:
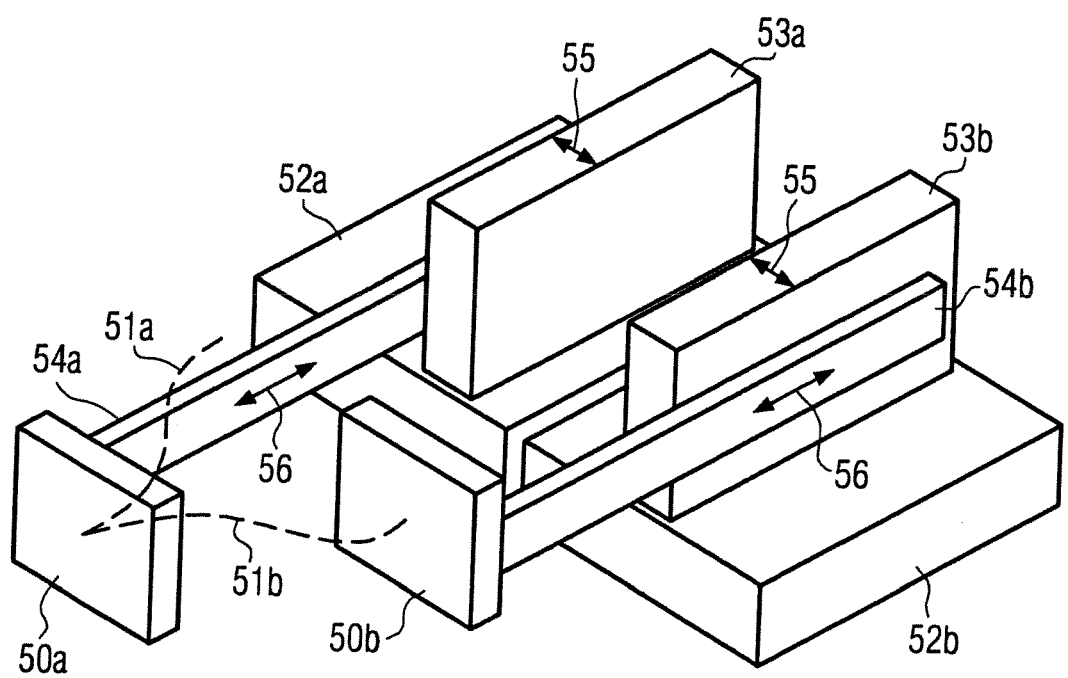

Another form of drive is illustrated in FIG. 5b. Here, an xy (dual-axis) drive is in each case provided for both of the transfer elements 50a, 50b which can be moved along the paths 51a and 51b. A motor actuator 52b can move another motor actuator 53b to and fro in the direction 55. The motor actuator 53b can move a beam 54b to and fro in a direction 56. The same applies correspondingly to the other transfer element 50a with the motor actuator 52a and 53a, as well as the beam 54a.

With this drive mechanism it is possible to move the two transfer elements 50*a*, 50*b* arbitrarily forwards, backwards and sidewards. A movement along the path 51*a* and 51*b* is possible with a superimposed movement of the two respective motor actuators. Also other paths can be realised here as required.

In FIG. 6 the transfer elements 63*a* and 63*b* are illustrated in their respective loading positions and the view is in the direction from the electrical testing head onto the device of FIG. 1. The test position 64 is illustrated dashed in the direction in front of the drawing plane.

Feed channels 62*a*, 62*b* for the two loading positions are illustrated above the loading position. These can be in a straight line and/or independent of one another. In FIG. 6 an embodiment is however illustrated in which both channels 62*a*, 62*b* are served from one common channel 60. Here, the switch 61 is schematically illustrated with which electronic components 3 to be tested can be directed from the channel 60 either into channel 62*a* or into channel 62*b*.

This design leads to a certain redundancy, because, for example, even with the failure of the transfer element 63*a* the other transfer element 63*b* can continue to operate with channel 62*b*.

Downstream from the loading positions two channels 66*a* and 66*b* are provided here, which can also be formed independently of one another. Preferably they lead straight downwards (refer also to FIG. 1 with channel 10).

In FIG. 6 however an embodiment is shown in which the two channels 66*a* and 66*b* open into a common channel 67. This facilitates the use of just one channel with appropriate branches into the containers 11, 12, 13, (refer to FIG. 1). With two independent channels double the number of branches are needed, which is more complicated mechanically.

FIG. 7 illustrates a possible arrangement of a number of transfer elements 5 arranged adjacently and one above the other.

Here, four transfer elements are provided adjacently and two transfer elements above one another. Electronic components 3 can be fed or removed along the channels 70, 71, 72.

The two left transfer elements 5 in the top row can, for example, be used to serve a common test position, whereas the two right transfer elements in the top row can be used to serve another test position.

The same applies correspondingly to the lower transfer elements 5.

The transfer elements 5 located respectively one above the other are advantageously mechanically coupled together directly or indirectly so that they can be moved together. Consequently, it is possible to serve two electrical test positions located one above the other respectively alternately with the transfer elements 5 of the first and second column (from the left in FIG. 7). The four transfer elements 5 on the left in FIG. 7 can be driven by a single motor. The same applies correspondingly to the four transfer elements 5 arranged on the right in FIG. 7.

When changing the electronic components to be tested, the electronic components 3 can be conveyed out of the respective top transfer elements 5 through the lower transfer elements 5 to the output and electronic components to be tested, which are for the respective lower transfer element, are passed through the upper transfer element.

Figure 8A:
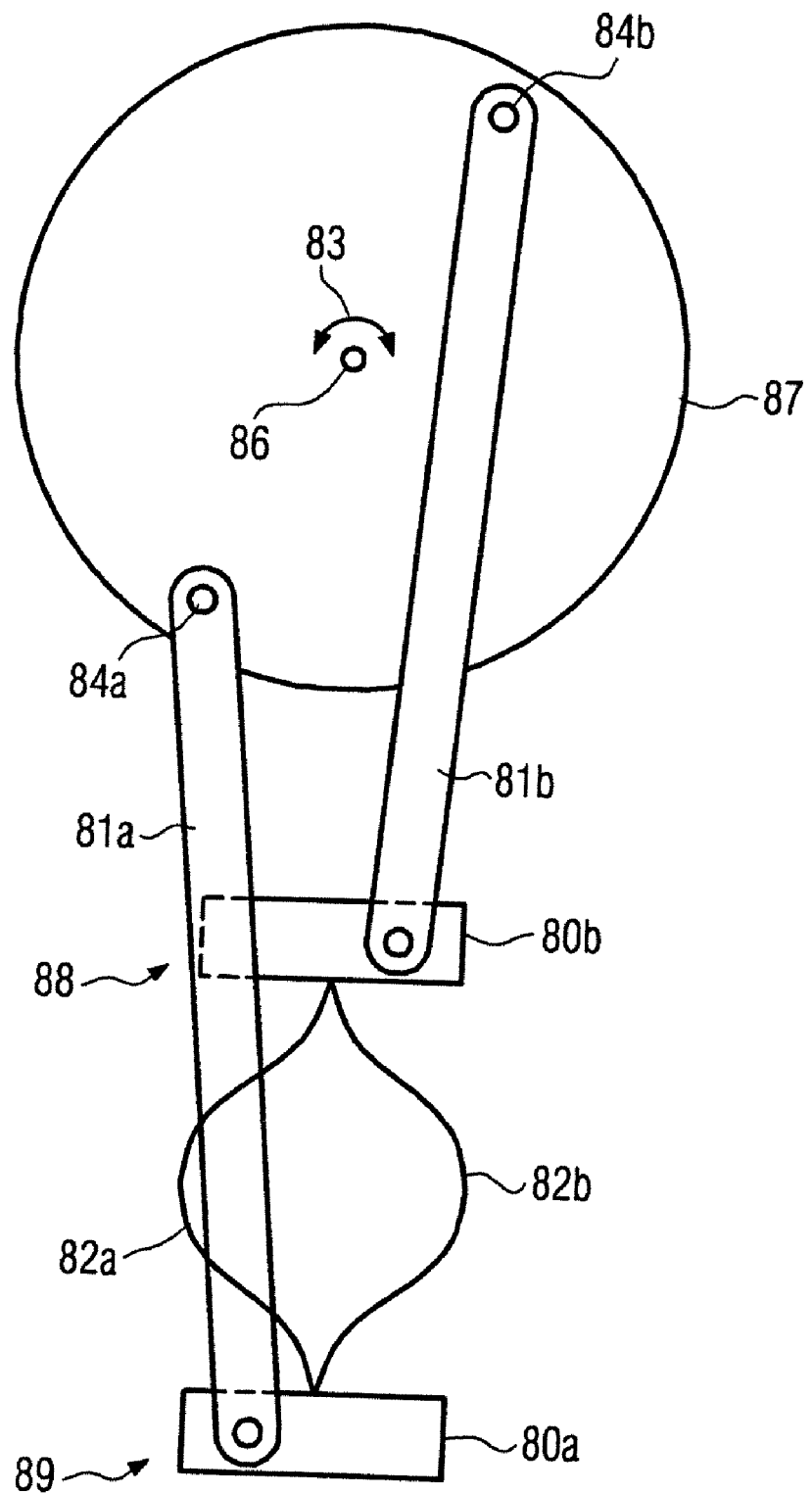
Figure 8B:
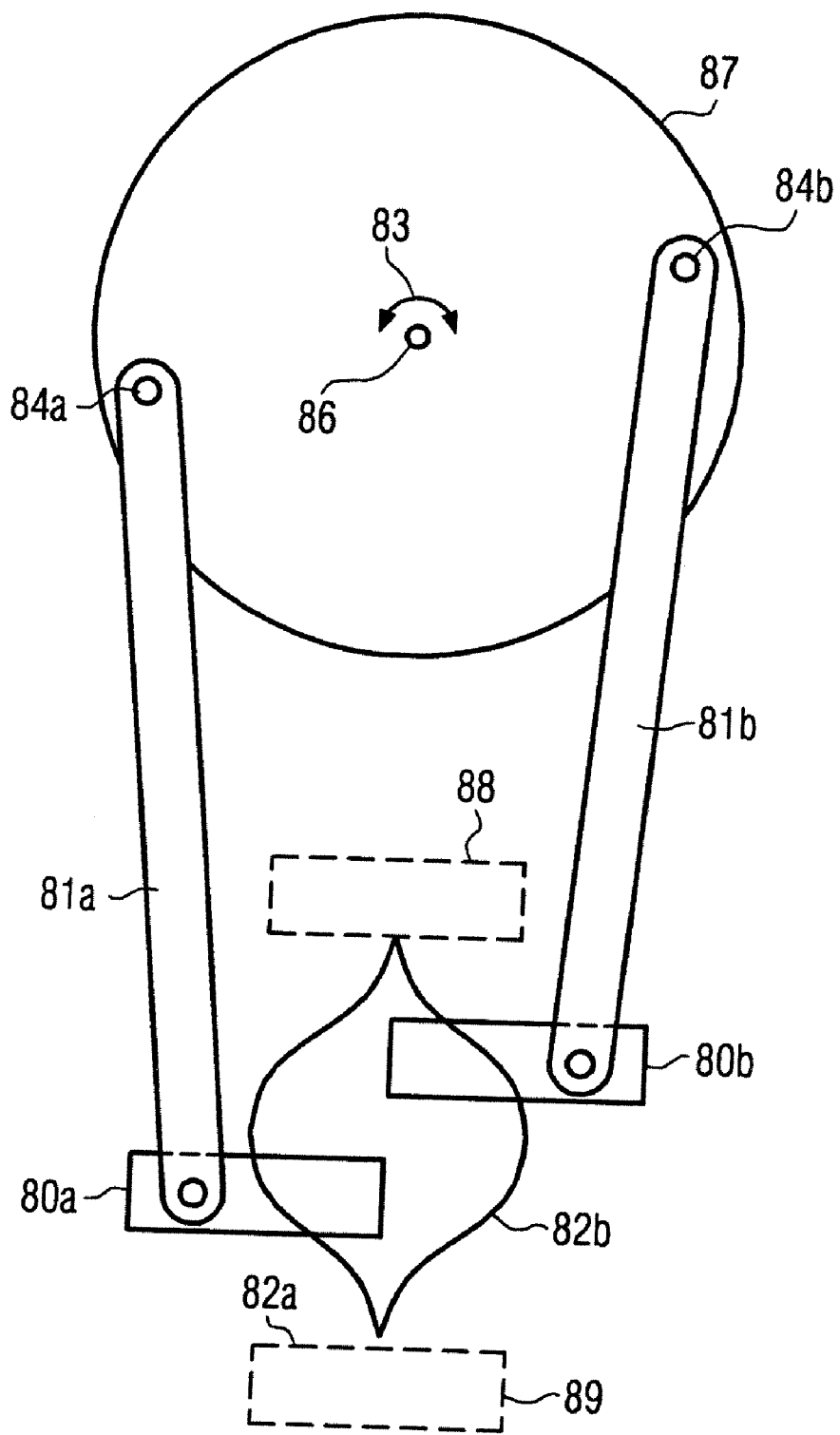

Another embodiment is illustrated in FIG. 8 in which a common loading position is provided for two transfer elements 80*a*, 80*b*. Two paths 82*a* and 82*b* are provided between the loading position 88 and the test position 89, wherein the transfer element 80*b* is to be moved along the path 82*b* and the transfer element 80*a* along the path 82*a* (refer also to FIG. 8*b*).

The drive is realised similar as shown in FIG. 5*a* with a rotating element 87 and two rods 81*a*, 81*b*, each of which is supported at rotating points 84*a*, 84*b*. Here, the rods engage directly with the transfer elements 80*a*, 80*b*, as is also possible in FIG. 5*a*.

Through rotation (refer to the double arrow 83) of the disc 87 from the position in FIG. 8*a* in the clockwise direction (refer to FIG. 8*b*) about an axle 86, the two transfer elements can each be moved along their paths and guided past one another. Thus, a change of the two transfer elements between the loading and test positions is possible.

A method of operation will now be explained using FIG. 9 as an example.

Figure 9A:
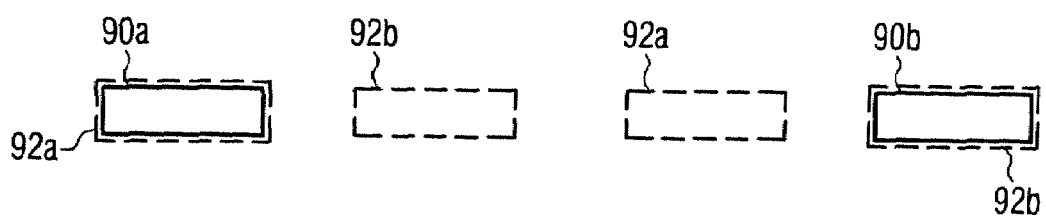

In FIG. 9*a* a transfer element 90*a* is illustrated in a loading position 92*a*. In this position it can be loaded with an electronic component to be tested.

The other transfer element 90*b* is located in the common test position 91. Here, it can be tested by the electrical testing head 8 (refer to FIG. 1).

Figure 9B:

After the termination of the electrical test the transfer element 90*b* is transferred from the common test position 91 into the loading position 92*b* (refer to FIG. 9*b*). In this position the tested electronic component can be output downwards (refer to FIGS. 1 and 6) and loaded with a new component to be tested.

While the transfer element 90*b* moves out of the common test position 91 into the loading position 92*b* or at least partially during this movement or also thereafter, the transfer element 90*a* can be transferred out of the loading position 92*a* into the common test position 91. Here, the component can then be tested.

Once this component has been tested, the transfer element 90*a* is moved out of the common test position 91 again back into the loading position 92*a* (refer to FIG. 9*a*) and in the meantime or thereafter the transfer element 90*b* is transferred out of the loading position with the new electronic component to be tested from the loading position 92*b* into the common test position 91 (refer to FIG. 9*a*). This sequence can be repeated to test many components.

The method of operation with the device from FIG. 8 is precisely the same except that two separate positions 92*a*, 92*b* are not provided, but instead there is a common loading position.

For the case where the loading and unloading times are very long in comparison to the electrical testing times, it may be advantageous if instead of two loading positions also three loading positions are provided from which electronic components can be transferred consecutively into a common test position.

Long loading and unloading times can arise in particular when a number of transfer elements are arranged one above the other (refer to FIG. 7). Also here it is possible to arrange not just two elements, but rather also three, four, five or more elements one above the other.

The invention claimed is:

1. Device for the testing of electronic components, comprising:
   at least two mechanical transfer elements, including a first transfer element configured to be placed and loaded with an electronic component at a first of two different loading positions and a second transfer element configured to be placed and loaded at a second of the two different loading positions, each of the at least two transfer elements being configured to travel from its corresponding loading position to a same single test position, wherein regardless of at which of the two different loading positions a respective transfer element has been loaded with the electronic component, the loaded electronic component is transferred to the same single test position for testing, and wherein the transfer elements are configured so that the electronic components drop into the transfer elements by the effect of the force of gravity and drop out of the transfer elements by the effect of the force of gravity.

2. Device according to claim 1, wherein paths from the loading positions to the test position are straight, curved, S-shaped or are composed of straight and curved sections.

3. Device according to claim 1, wherein at least one or two transfer elements exhibit a same orientation in the loading position as in the test position.

4. Device according to claim 3, wherein at least one or two transfer elements on the path between the loading position and test position always exhibit the orientation as in the loading and test positions.

5. Device according to claim 3, wherein one or two transfer elements at least on one or more parts of a path between the loading position and test position or also on the path exhibit a rotated orientation in relationship to the orientation as in the loading and test positions.

6. Device according to claim 1, wherein at least one or two transfer elements exhibit a different orientation in the loading position and in the test position.

7. Device according to claim 1, wherein paths between the two loading positions and the test position run congruently at least in the region directly in front of the test position.

8. Device according to claim 1, wherein paths for the transfer elements between the loading position and test position are defined by guides such as rod,rails, grooves or cranks.

9. Device according to claim 1, wherein the transfer elements are moved between the loading position and test position in each case by a single, dual or multi-axle drive.

10. Device according to claim 1, wherein the two transfer elements are connected to a common driving means.

11. Device according to claim 10, wherein the two transfer elements are joined via mechanically rigid joining elements such as rods or shaped elements to the common driving means.

12. Device according to claim 10, wherein the common driving means comprises a rotating element such as a rotary table or a rotating cylinder, which can be driven pneumatically, electrically, hydraulically, with a stepper motor or servomotor.

13. Device according to claim 1, wherein electronic components can be fed to the two loading positions independently of one another or that the two loading positions can be fed with electronic components via an at least partially common channel.

14. Device according to claim 1, wherein at least one or two transfer elements are coupled in each case to a further transfer element.

15. The device of claim 1, wherein the first transfer element is configured to travel along a first spatial path between the first loading position and the single test position, the second transfer element is configured to travel along a second spatial path between the second loading position and the single test position, the first and second spatial paths being at least partially different.

16. The device of claim 1, wherein the first transfer element is configured to occupy the single test position at least partially while the second transfer element occupies the second loading position, and the second transfer element is configured to occupy the single test position at least partially while the first transfer element occupies the first loading position.

17. The device of claim 1, wherein the first and second transfer elements reciprocate between the first and second loading positions and the single test position, the first transfer element configured to move from the first loading position to the single test position while the second transfer element moves from the single test position to the second loading position.

18. Method for the testing of electronic components, comprising the steps:
a first transfer element is placed and loaded with an electronic component at a first loading position, wherein the electronic component drops into the first transfer element by the effect of the force of gravity;
a second electronic component in a second transfer element, which is located at a single test position, is tested at least partially simultaneously with the loading of the first transfer element;
after the testing of the second electronic component in the second transfer element, the second transfer element is passed to a second loading position to output the electronic component downwards due to the force of gravity;
thereafter or at least partially simultaneously with the passing of the second transfer element, the first transfer element is passed to the single test position and transfers the electronic component thereto, wherein regardless of at which one of the two loading positions a respective transfer element has been loaded with the electronic component, the loaded electronic component is transferred to the same single test position for testing.

19. The method of claim 18, wherein the first transfer element is configured to travel along a first spatial path between the first loading position and the single test position, the second transfer element is configured to travel along a second spatial path between the second loading position and the single test position, the first and second spatial paths being at least partially different.

20. A device-testing apparatus, comprising:
a first transfer element configured to receive electronic components by gravity loading at a first loading position and transfer the electronic components from the first loading position to a single test position;
a second transfer element configured to receive electronic components by gravity loading at a second loading position and transfer the electronic components from the second loading position to the single test position, wherein the second loading position is a different loading position than the first loading position,
wherein the first and second transfer elements are configured to move independently of each other and along at least partially different spatial paths than each other, and
wherein the first transfer element is configured to occupy the single test position at least partially while the second transfer element occupies the second loading position, and the second transfer element is configured to occupy the single test position at least partially while the first transfer element occupies the first loading position.

21. The device-testing apparatus of claim 20, wherein the first and second transfer elements reciprocate between the first and second loading positions and the single test position, the first transfer element configured to move from the first loading position to the single test position while the second transfer element moves from the single test position to the second loading position.

* * * * *